(12) United States Patent
Greening et al.

(10) Patent No.: US 9,594,122 B2
(45) Date of Patent: Mar. 14, 2017

(54) ESTIMATING STATE OF CHARGE (SOC) AND UNCERTAINTY FROM RELAXING VOLTAGE MEASUREMENTS IN A BATTERY

(71) Applicant: Apple Inc., Cupertino, CA (US)

(72) Inventors: Thomas C. Greening, San Jose, CA (US); Jeffrey G. Koller, Oxnard, CA (US); Nils E. Mattisson, San Francisco, CA (US); P. Jeffrey Ungar, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 10 days.

(21) Appl. No.: 14/841,095

(22) Filed: Aug. 31, 2015

(65) Prior Publication Data

US 2015/0369868 A1    Dec. 24, 2015

Related U.S. Application Data

(62) Division of application No. 13/622,852, filed on Sep. 19, 2012, now Pat. No. 9,128,162.

(51) Int. Cl.
| | |
|---|---|
| *G01R 31/36* | (2006.01) |
| *H01M 10/48* | (2006.01) |
| *H01M 10/42* | (2006.01) |
| *H01M 10/0525* | (2010.01) |

(52) U.S. Cl.
CPC ....... *G01R 31/362* (2013.01); *G01R 31/3648* (2013.01); *G01R 31/3651* (2013.01); *H01M 10/48* (2013.01); *G01R 31/3634* (2013.01); *G01R 31/3679* (2013.01); *H01M 10/0525* (2013.01); *H01M 10/4285* (2013.01)

(58) Field of Classification Search
None
See application file for complete search history.

(56) References Cited

U.S. PATENT DOCUMENTS

2009/0326842 A1\* 12/2009 Thomas-Alyea .... G01R 31/362
702/64

\* cited by examiner

*Primary Examiner* — Miriam Stagg
*Assistant Examiner* — Carmen Lyles-Irving
(74) *Attorney, Agent, or Firm* — Blank Rome LLP

(57) ABSTRACT

Some embodiments of the present invention provide a system that estimates a state of charge for a battery. During operation, while the battery is relaxing toward a fully rested state, the system determines if a modified state of charge of the battery is substantially consistent with a predetermined decay pattern. If so, the system estimates the state of charge of the battery as a value of the modified state of charge determined at the time when the consistency is observed. Otherwise, the system continues monitoring the modified state of charge of the battery. In one embodiment, the predetermined decay pattern is a single exponential decay. After estimating the state of charge of the battery, the system may determine an uncertainty of the estimated state of charge. More specifically, the system can estimate the uncertainty as substantially equal to a fraction of the difference between the value of the modified state of charge and the value of the voltage-based state of charge at the time when the consistency is observed.

24 Claims, 8 Drawing Sheets

ESTIMATING STATE OF CHARGE (SOC) AND UNCERTAINTY FROM RELAXING VOLTAGE MEASUREMENTS IN A BATTERY

BACKGROUND

1. Field

The present invention generally relates to techniques for charging/discharging a rechargeable battery. More specifically, the present invention relates to a method and apparatus for estimating state of charge and the associated uncertainty based on measured relaxing voltage of the battery.

2. Related Art

Rechargeable lithium-ion batteries are presently used to provide power in a wide variety of systems, including smartphones, wireless devices, laptop computers, cordless power tools and electric vehicles. State of charge (SOC) is a measure of a present capacity of a battery expressed in percentage points (0%=empty; 100%=full). Accurately estimating the state of charge for a battery is fundamental to basic battery management, such as determining full charge capacity, reserve capacity, and battery health.

State of charge of a battery can be estimated using a number of techniques. For example, a voltage-based state-of-charge estimation technique first measures a resting voltage of the battery, and the state of charge can then be derived from the resting voltage value based on a predetermined voltage vs. SOC relationship which has been calibrated for the battery. This technique is straightforward but can be inaccurate if the battery is not fully rested when the voltage measurement is taken. Note that after current stops flowing to the cell, it can take a long time, often up to hours, for the cell to become fully rested. In contrast, a coulomb-counting-based state-of-charge estimation technique determines the state of charge for a battery by measuring the charge that flows in and out of the battery. However, this technique also has associated sources of uncertainty, which include, but are not limited to, measurement offset errors, and slow changes in the battery's coulomb capacity.

Another state-of-charge estimation technique combines the voltage-based technique with the coulomb-counting-based technique to achieve a higher accuracy. Note that when combining the coulomb-counting-based SOC estimate and the voltage-based SOC estimate, it is necessary to take into account uncertainties from both techniques. It is generally safe to overestimate these uncertainties since the uncertainty of combined state-of-charge estimates will encompass the true state of charge. However, if an uncertainty is underestimated or missing from consideration, more serious problems can occur. For example, the two SOC estimates can appear inconsistent with each other, thereby causing a safety condition to be triggered, while in reality the problem is simply that the uncertainty in one of the estimates is significantly underestimated.

As mentioned above, a significant source of uncertainty in the combined estimate not yet taken into account is caused by the error in the voltage-based SOC estimate due to a not fully rested cell. In principle, the open circuit voltage for a fully relaxed bank (of cells) is used with pre-characterized open circuit voltage (OCV) curves to estimate the voltage-based state-of-charge independent of the coulomb count. The problem arises as a result of how the "fully relaxed" state is defined. For example, in one voltage-based technique, a bank is considered fully relaxed when the magnitude of the derivative of the voltage is below a threshold of 4 µV/sec. In another voltage-based technique, a fully relaxed bank is defined as the magnitude of the derivative of the voltage-based state-of-charge less than 0.5%/hr.

However, both of the above-described voltage-based techniques suffer from the residual error in the state-of-charge estimate due to a bank which is not fully relaxed. This problem is particularly troublesome at cold temperatures because in such conditions the relaxation process is long, and on flat parts of the OCV curve where the threshold values are reached, small changes in voltage can cause large changes in the state of charge. FIG. 1 illustrates how using derivatives to define a fully rested cell can lead to large errors at cold temperatures and at flat parts of the OCV curves. Note that at 58.6% state of charge it takes about 159 minutes for the derivative of the voltage-based state-of-charge to reach 0.5%/hr. At this point the state of charge is still not fully rested with a 0.6% residual error. Using the other fully relaxed definition, the voltage reaches 4 µV/sec at about 103 minutes with a 1.0% residual error. If this uncertainty is not taken into account, the difference between the voltage-based state-of-charge and the coulomb-counter-based state-of-charge can be large enough to incorrectly trigger a problem diagnosis, provided that the coulomb-counter-based state-of-charge uncertainty is relatively small.

Hence, what is needed is a method and an apparatus for accurately estimating a state of charge and the associated uncertainty for a relaxed battery without the above-described problems.

SUMMARY

The described embodiments provide a system that estimates a state of charge for a battery. During operation, while the battery is relaxing toward a fully rested state, the system determines if a modified state of charge of the battery is substantially consistent with a predetermined decay pattern. If so, the system estimates the state of charge of the battery as a value of the modified state of charge determined at the time when the consistency is observed. Otherwise, the system continues monitoring the modified state of charge of the battery. In one embodiment, the predetermined decay pattern is a single exponential decay. Note that determining if the modified state of charge of the battery is substantially consistent with the predetermined decay pattern is equivalent to determining if the voltage-based state of charge substantially matches the predetermined decay pattern.

In some embodiments, the system determines if the modified state of charge of the battery is substantially consistent with the predetermined decay pattern by first computing a rate of change of the modified state of charge. Next, the system determines whether the rate of change of the modified state of charge has become less than a threshold rate of change. In one embodiment, the threshold rate of change is ~0.4%/hour.

In some embodiments, the system computes the rate of change of the modified state of charge by computing both a first value of the modified state of charge at a first time and a second value of the modified state of charge at a second time, wherein the first time and the second time are separated by a predetermined time interval.

In some embodiments, the system derives the modified state of charge from the voltage-based state of charge of the battery. More specifically, the system first determines one or more sample values of the voltage-based state of charge of the battery. The system also computes a first time derivative of the voltage-based state of charge. The system additionally computes a time constant associated with the predetermined decay pattern. Next, the system determines the value of the modified state of charge based on the value of the voltage-based state of charge, the first time derivative of the voltage-based state of charge, and the computed time constant.

In some embodiments, to compute the time constant, the system computes a second time derivative of the voltage-based state of charge. The system then computes the time constant as the ratio of the first time derivative and the second time derivative of the voltage-based state of charge.

In some embodiments, the system determines the value of the voltage-based state of charge by first measuring an open circuit voltage of the battery. The system then determines the value of the voltage-based state of charge based at least on the open circuit voltage.

In some embodiments, after estimating the state of charge of the battery, the system further determines an uncertainty of the estimated state of charge. More specifically, the system can estimate the uncertainty of the estimated state of charge as substantially equal to a fraction of the difference between the value of the modified state of charge and the value of the voltage-based state of charge at the time when the consistency is observed. In one embodiment, the fraction is ⅓.

In some embodiments, the system also determines a coulomb-counting-based state of charge of the battery. The system can then compute an updated state of charge of the battery based on both the modified state of charge and the coulomb-counting-based state of charge at the time when the consistency is observed.

In some embodiments, after determining that the modified state of charge of the battery is not consistent with the predetermined decay pattern, the system estimates the state of charge of the battery using the coulomb-counting-based state of charge.

One embodiment of the present invention provides a battery with a state-of-charge estimation mechanism. This battery includes a voltage sensor to measure a voltage across terminals of the battery. The state-of-charge estimation process is under the control of a controller, which receives inputs from the voltage sensor, and generates a state-of-charge estimate. During operation, while the battery is relaxing toward a fully rested state, the controller determines if a modified state of charge of the battery is substantially consistent with a predetermined decay pattern. If so, the controller outputs a state-of-charge estimate for the battery as a value of the modified state of charge determined at the time when the consistency is observed. Otherwise, the controller continues monitoring the modified state of charge of the battery.

DESCRIPTION

Figure 1:
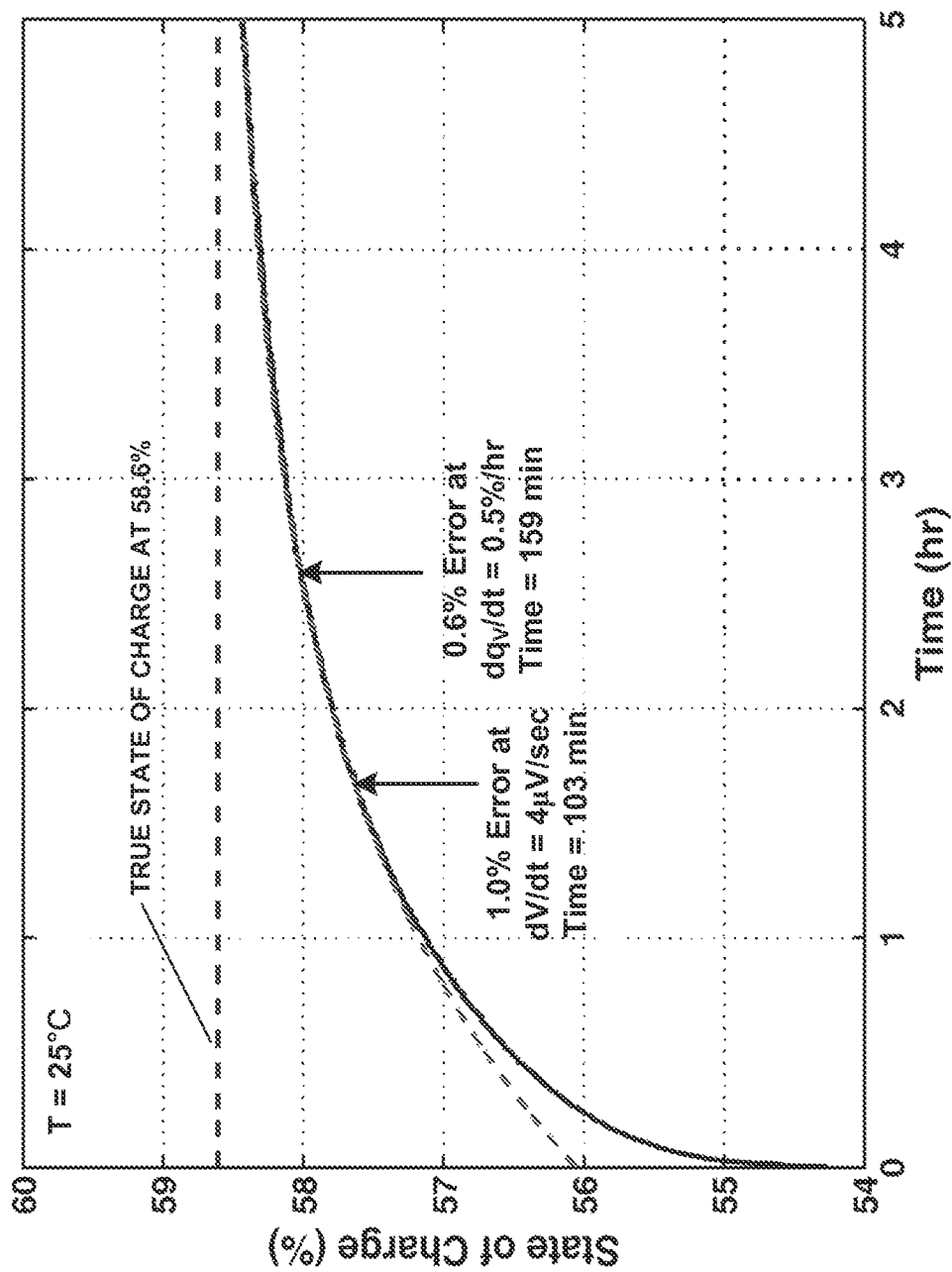
FIG. 1 illustrates how using derivatives to define a fully rested cell can lead to large errors at cold temperatures and at flat parts of the OCV curves.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Terminology

Throughout the specification, the following terms have the meanings provided herein, unless the context clearly dictates otherwise. The term "battery" generally means a rechargeable battery which includes a cell pack/bank (with one or more cells). Hence, a term such as "a state of charge of a battery" means "a state of charge of the cell pack/bank within the battery," and "an open circuit voltage of the battery" means "an open circuit voltage of the cell pack/bank within the battery." The terms "fully rested" and "fully relaxed" are used interchangeably. Further, the terms "state of charge" and "state-of-charge," and their abbreviation "SOC" are used interchangeably.

A Relaxation-Corrected State-of-Charge Estimation

The relaxation of the open circuit cell voltage after current has stopped flowing is primarily caused by the diffusive redistribution of lithium in the cell electrodes. Once a steady state has been reached, the voltage across the cell can be correlated to the state of charge with a minor linear temperature correction, where the correlation and temperature dependence can be pre-characterized and stored as a set of curves in the battery pack. In some embodiments, the function to convert a rested open circuit voltage V into the voltage-based state-of-charge $q_v$ can be expressed as VoltageToSOC(V, i, T, h):

$$q_v = \text{VoltageToSOC}(V, i, T, h), \quad (1)$$

wherein V is the rested open circuit voltage, i is the rest current or a provided current less than the actual rest current, T is the temperature, and h is the hysteresis state.

In an ideal diffusion process, such as for a uniform slab with uniform boundary conditions, the diffusion equation predicts that the relaxation of the voltage-based state-of-charge $q_v$ can be expressed as an infinite sum of exponentials (with the removal of a constant current steady-state condition) as:

$$q_V = q_T + \sum_{k=1}^{\infty} \frac{\Delta q_k}{k^2} e^{-k^2 t/\tau} \quad (2)$$

wherein $q_T$ is the true state of charge, $\Delta qk$ is the amplitude of the relaxation that depends on many factors including the current before relaxation, t is the time, and $\tau$ is a characteristic time constant. Note that the infinite sum of exponentials with time constants inversely proportional to k2 fades quickly until only the slowest exponential (k=1) term remains, at which point Equation 2 becomes a single exponential decay. The $\Delta qk$ factors are typically proportional to 1/k2 and are typically smaller in magnitude for higher values of k, though they can also depend on the amplitude of the current that occurred in the most recent $\tau$/k2 timeframe.

However, Equation 2 typically cannot be used as given because a battery is not a single uniform slab, but instead is comprised of two separate electrodes, each with its own diffusive characteristics. In addition, because constant current steady-state behavior before rest cannot be assumed, the amplitudes of the various $\Delta qk$ terms cannot be assumed. Instead, it is reasonable to assume that at some point in time all of the higher order k terms will decay away leaving a single exponential term. Considering only a k value of 1, Equation 2 can be rewritten as:

$$q_v = q_T + \Delta q_1 \cdot e^{-t/\tau}. \quad (3)$$

Figure 2:
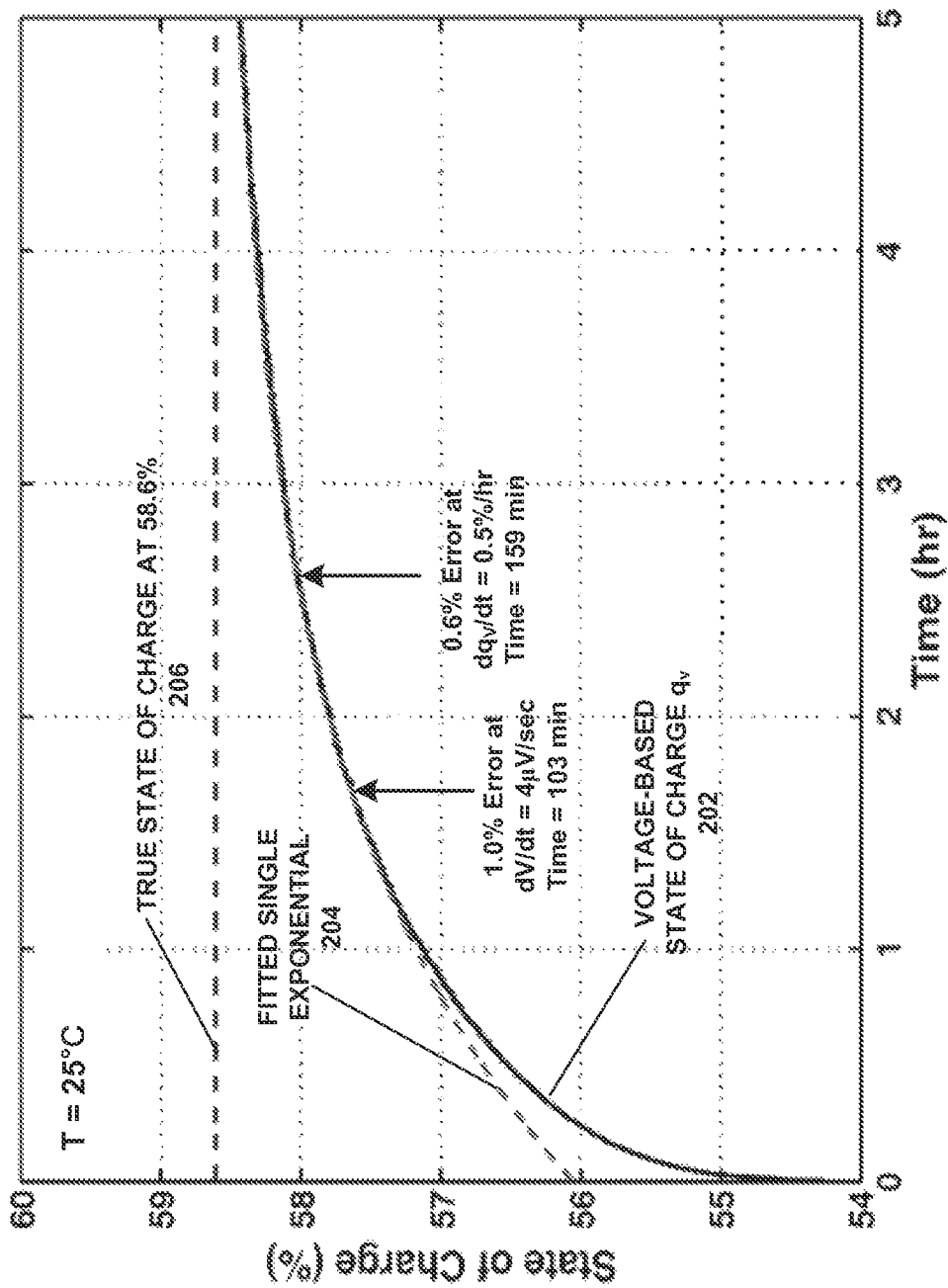
FIG. 2 illustrates the relaxing voltage-based state-of-charge $q_v$, a fitted single exponential based on Equation 3, and the true state-of-charge $q_T$ in accordance with some embodiments herein.

FIG. 2 illustrates the relaxing voltage-based state-of-charge $q_v$ (solid curve 202), a fitted single exponential based on Equation 3 (dashed curve 204), and the true state-of-charge $q_T$ (dashed line 206) in accordance with some embodiments herein. Note that the single exponential curve 204 does not initially fit the relaxation data 202 very well, but fits extremely well after the higher order exponential factors decay away around 1.5 hours. Hence, it is possible to create a program which monitors the timed decay of $q_v$ and checks (based on the derivative) to see if the relaxation curve 202 has changed into a single exponential. When this happens, the program can then estimate the state of charge using Equation 3. However, directly using Equation 3 to estimate true state-of-charge $q_T$ can be challenging due to lack of information on coefficient $\Delta qk$. FIG. 2 also indicates that a 0.6% error occurs using the previous definition of fully rested when the derivative of the voltage-based state-of-charge reaches 0.5%/hr; and a 1.0% error occurs using another previous definition of a fully rested state when the derivative of the voltage reaches 4 µV/sec.

In one embodiment, rather than using Equation 3 in a straightforward way, time derivatives of the equation are first computed. The first time derivative of Equation 3 is given by:

$$\frac{dq_V}{dt} = -\frac{\Delta q_1}{\tau} e^{-t/\tau}, \quad (4)$$

and the second derivative is given by:

$$\frac{d^2 q_V}{dt^2} = \frac{\Delta q_1}{\tau^2} e^{-t/\tau}. \quad (5)$$

Using Equation 4 and Equation 5, one can solve for the characteristic time constant T by taking the ratio of the first derivative to the second derivative:

$$\frac{\frac{dq_V}{dt}}{\frac{d^2 q_V}{dt^2}} = -\tau. \quad (6)$$

The relaxation equation (Equation 3) can then be combined with the second derivative equation (Equation 5) and Equation 6, and rewritten to solve for a relaxation-corrected state-of-charge $q_r$, renamed from $q_T$ to distinguish it from the true state-of-charge $q_T$:

$$q_r = q_V + \tau \cdot \frac{dq_V}{dt}. \quad (7)$$

Note that while $q_v$ represents a conventional voltage-based relaxing state-of-charge, $q_r$ is the state of charge corrected based on $q_v$ by taking into account relaxation-related uncertainty, and hence is closer to the true state-of-charge $q_T$.

Consequently, one technique for computing the relaxation-corrected state-of-charge $q_r$ from the still relaxing $q_v$ is to first calculate the first and second derivatives to determine the characteristic time constant T using Equation 6. With the evaluated T, the relaxation-corrected state-of-charge $q_r$ can then be computed using Equation 7. In some embodiments, the relaxation-corrected state-of-charge $q_r$ can also be obtained based on an alternative form of Equation 7:

$$q_r = q_V - \left(\frac{dq_V}{dt}\right)^2 \bigg/ \frac{d^2 q_V}{dt^2}. \quad (7)'$$

Note that using Equation 7', the relaxation-corrected state-of-charge $q_r$ can be obtained after computing the first and second derivatives of $q_v$. Hereinafter, the term "Equation 7" refers to both Equation 7 and Equation 7' stated above.

Note that because Equation 7 assumes that the higher order exponential terms of the diffusion process have decayed away, the relaxation-corrected state-of-charge qr will not be immediately valid. In one embodiment, determining if the relaxation-corrected state-of-charge qr of Equation 7 becomes a valid SOC estimate is to determine if the voltage-based relaxing state-of-charge $q_v$ has substantially turned into a single exponential decay pattern. Alternatively, because the true state-of-charge $q_T$ can be considered a constant (the current is insignificant when resting), the state-of-charge model based on Equation 7 can be considered valid when the derivative of the relaxation-corrected state-of-charge $q_r$ approaches zero.

In some embodiments, the transition $$\left|\frac{dq_V}{dt}\right|$$

from using only coulomb-counting-based state-of-charge to using the voltage-based state-of-charge occurs when the magnitude of the derivative of the voltage-based state-of-charge is less than 0.5%/hr. Alternatively, one embodiment of the present invention assumes that transition to using the $$\left|\frac{dq_r}{dt}\right|$$

relaxation-corrected state-of-charge $q_r$ occurs when the magnitude of the derivative of the relaxation-corrected state-of-charge is less than ~0.4%/hr, indicating that the relaxation model based on Equation 7 is producing steady values consistent with a single dominant exponential decay assumption for the voltage-based relaxing state-of-charge $q_v$.

Note that one difference between the proposed technique based on the relaxation-corrected state-of-charge $q_r$ and the technique based on the voltage-based state-of-charge $q_v$ is that, rather than wait for the voltage-based state-of-charge to stop changing, the proposed technique waits for the relaxation-corrected state-of-charge to become predictable, i.e., when the $q_v$ value becomes a single exponential. Generally, the time of transition of $q_r$ or $q_v$ based on a signal exponential observation occurs significantly earlier than the time when a conventional fully relaxed definition in $q_v$ is satisfied, thereby allowing the time for the rest measurement to be reduced. In one embodiment, after the transition to a single dominant exponential decay has occurred, the system begins to estimate the state of charge of the battery as a weighted combination of the voltage-based state-of-charge and the coulomb-counting-based state-of-charge.

Conservatively, the 3-Sigma uncertainty σr in the relaxation-corrected state-of-charge $q_r$ can be taken as the relaxation correction term in Equation 7. This technique has the advantage that the uncertainty goes to zero as the derivative of the voltage-based state-of-charge $q_v$ goes to zero:

$$\sigma_r = \frac{\tau}{3} \cdot \left|\frac{dq_V}{dt}\right|. \qquad (8)$$

Note that the 3-Sigma uncertainty based on Equation 8 is essentially the difference between relaxation-corrected state-of-charge $q_r$ and the voltage-based state-of-charge $q_v$. Moreover, the correction based on 3-Sigma uncertainty is an overestimation of the true uncertainty, wherein the true uncertainty may be derived from the uncertainties in the first and second derivatives and the applicability of the model. However, this 3-Sigma uncertainty has empirically been determined to adequately overestimate the true uncertainty.

Figure 3:
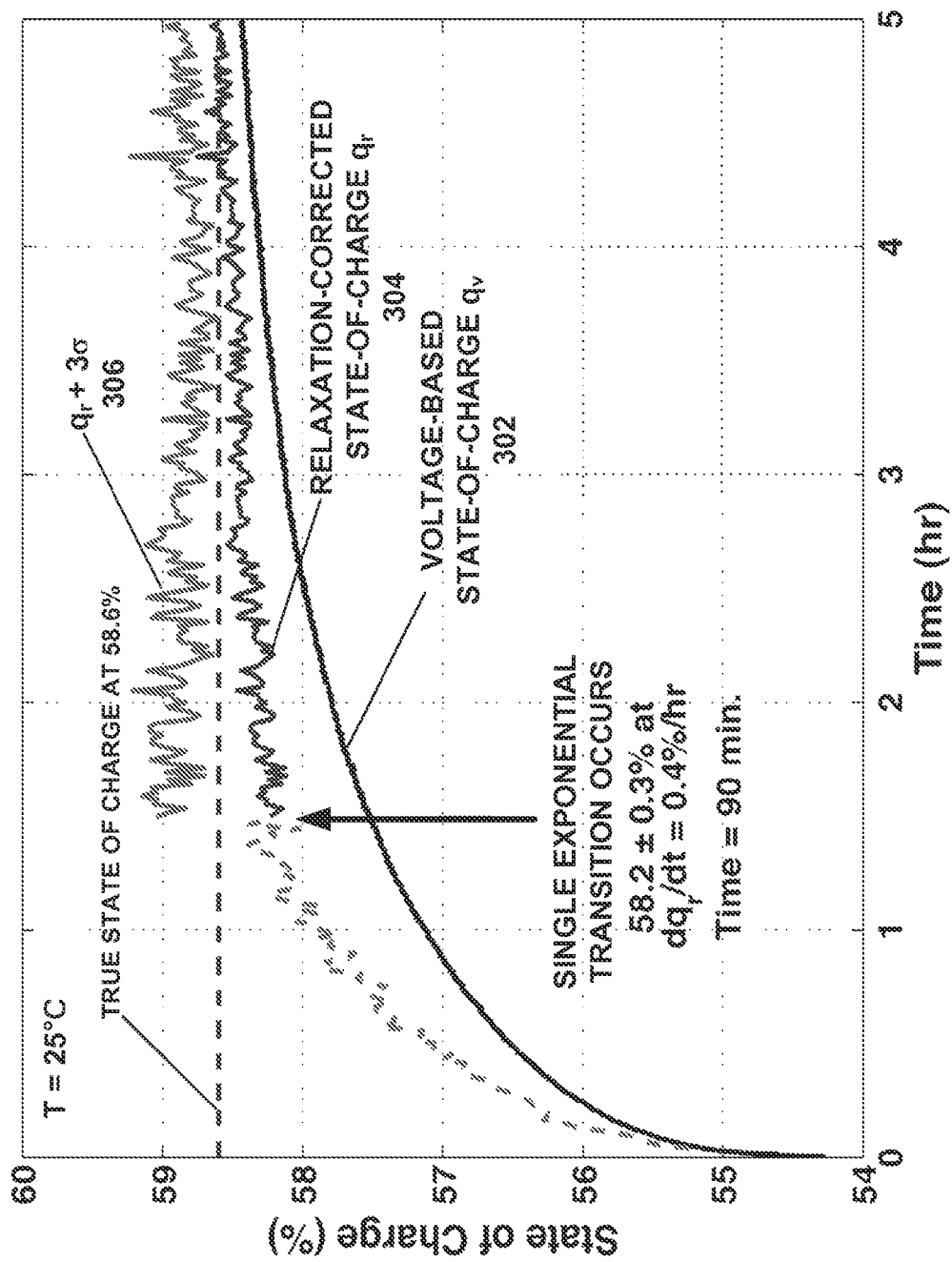
FIG. 3 illustrates the relaxation-corrected state-of-charge $q_r$ as a function of time and 3-Sigma uncertainty taken as size of correction to $q_r$ in accordance with some embodiments herein.

FIG. 3 illustrates the relaxation-corrected state-of-charge $q_r$ as a function of time and 3-Sigma uncertainty taken as size of correction to $q_r$ in accordance with some embodiments herein. As seen in FIG. 3, $q_v$ curve 302 provides the minus (i.e., the lower) 3-Sigma bound for the relaxation-corrected state-of-charge $q_r$ curve 304. In this embodiment, the conventional estimate $q_v$ curve 302 becomes the most conservative estimate. Further, $q_r$+3σ curve 306 provides the plus (i.e., the upper) 3-Sigma bound for the relaxation-corrected state-of-charge $q_r$ curve 304. In the example shown, when the derivative of the relaxation-corrected state-of-charge $q_r$ reaches 0.4%/hr at 90 minutes, the state of charge is estimated to be 58.2±0.3%, which is only 1.3 Sigma lower than the true SOC value at 58.6%. Hence, the relaxation-corrected state-of-charge $q_r$ provides a significantly more accurate SOC estimate than the previously described techniques which used alternative fully rested definitions (i.e., derivative of the voltage is below 4 μV/sec, or the magnitude of the derivative of the voltage-based state-of-charge less than 0.5%/hr).

Implementation of the Relaxation-Corrected State-of-Charge

One challenge in determining the relaxation-corrected state-of-charge $q_r$ is to accurately estimate the first and second derivatives (needed to compute time constant τ). The proposed technique attempts to balance frequency of the derivative calculations and ease of calculation while minimizing the memory requirements. Generally speaking, to measure a derivative, one calculates the change in the value over some interval of time. The second derivative can be simply a measure of the change in the first derivative. To accurately measure these derivatives, the interval of time needs to increase as the change in the state-of-charge value decreases.

Figure 4:
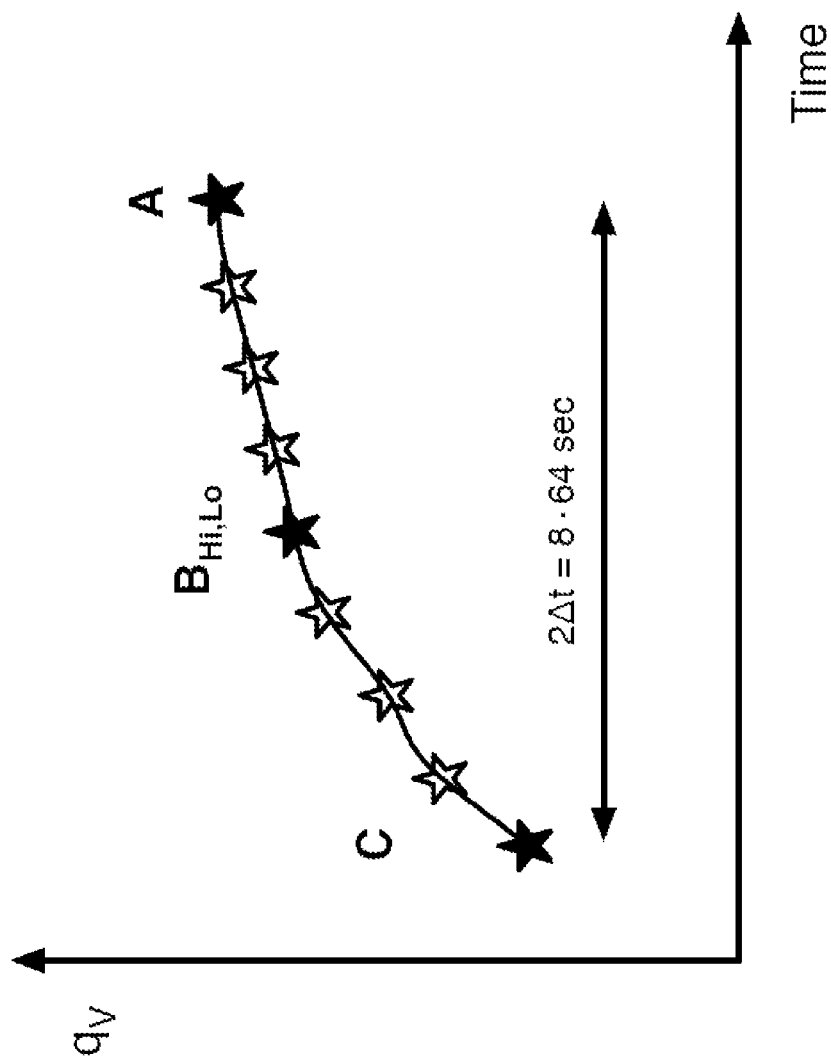
FIG. 4 illustrates an exemplary technique of computing the first and second derivatives of the voltage-based state-of-charge $q_v$ in accordance with some embodiments herein.

FIG. 4 illustrates an exemplary technique of computing the first and second derivatives of the voltage-based state-of-charge $q_v$ in accordance with some embodiments herein. As illustrated in FIG. 4, the first and second derivatives are calculated from three moving samples (labeled A, B, and C) separated by time interval Δt. In one embodiment, the minimum time interval Δt for the computation of the first and second derivatives computation is 64 seconds which is the result of the voltage-based state-of-charge estimates $q_v$ filtered with a single-pole filter with a bandwidth of 64 seconds. The parameter 2Δt is initially set to 2·64 seconds, but increments in units of 64 seconds as the change in $q_v$ decreases. At the iteration illustrated in FIG. 4, 2Δt has increased to 8·64 seconds between samples A and C.

Based on the above-described sampling technique, the first derivative at sample point B can be expressed as:

$$\frac{dq_V}{dt_B} = \frac{q_{V,A} - q_{V,C}}{2\Delta t}, \qquad (9)$$

while the second derivative at point B can be expressed as:

$$\frac{d^2 q_V}{dt_B^2} = \frac{q_{V,A} + q_{V,C} - 2q_{V,B}}{(\Delta t)^2}. \qquad (10)$$

Figure 5A:
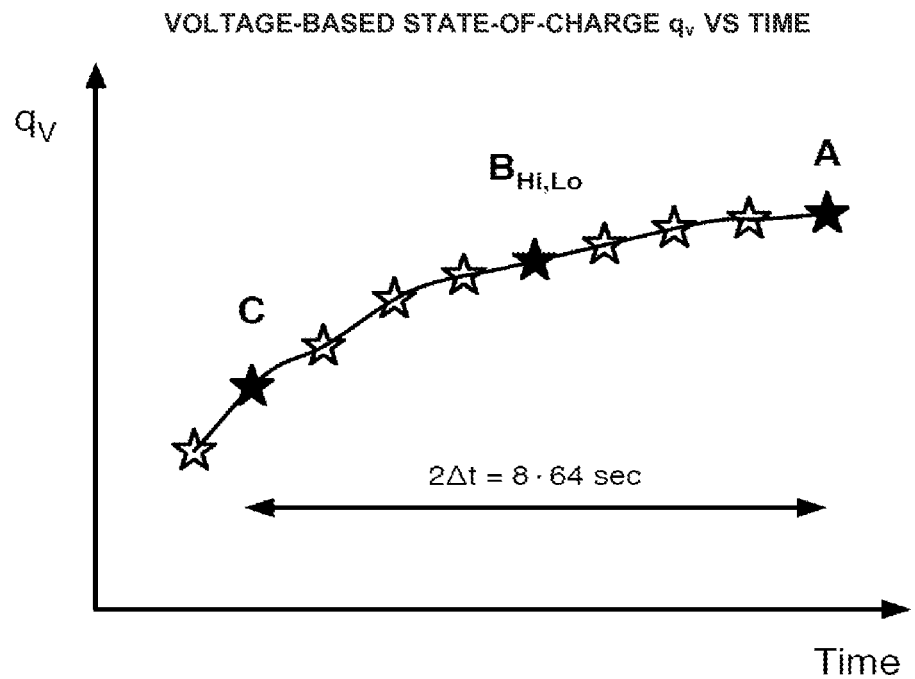
FIG. 5A illustrates the next iteration from the iteration illustrated in FIG. 4 with an unchanged 2Δt interval in accordance with some embodiments herein.
Figure 5B:
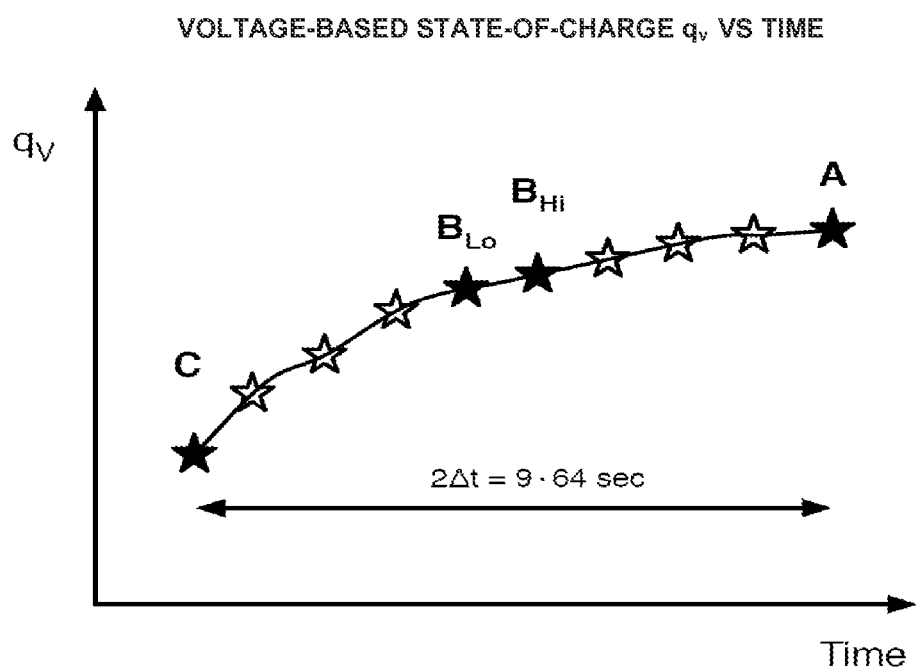
FIG. 5B illustrates the next iteration from the iteration illustrated in FIG. 4 with an increased 2Δt interval in accordance with some embodiments herein.

FIG. 5A illustrates the next iteration from the iteration illustrated in FIG. 4 with an unchanged 2Δt interval in accordance with some embodiments herein. As shown in FIG. 5A, the samples A, B, and C have all moved forward by one unit of 64 seconds, and the 2Δt interval remains at 8·64 seconds. FIG. 5B illustrates the next iteration from the iteration illustrated in FIG. 4 with an increased 2Δt interval in accordance with some embodiments herein. As shown in FIG. 5B, while sample A has moved forward by one unit of 64 seconds, the sample C has not, causing the 2Δt interval to increment by one unit of 64 seconds to 9·64 seconds.

Note that if the number of samples between samples A and C is even, such as in the example of FIG. 5B, then the value at sample B can be computed as the average between a sample "BLo" right before the midpoint between sample A and C, and a sample "BHi" right after the midpoint:

$$q_{V,B} = \frac{q_{V,BLo} + q_{V,BHi}}{2}. \tag{11}$$

On the other hand, if the number of samples between samples A and C is odd, such as in the example of FIG. 5A, then sample BLo and sample BHi can be the same sample. By generally replacing sample B with two samples BLo and BHi, Equation 10 for the second derivative can be rewritten using Equation 11 as:

$$\frac{d^2 q_V}{dt_B^2} = \frac{q_{V,A} + q_{V,C} - q_{V,BLo} - q_{V,BHi}}{(\Delta t)^2}. \tag{12}$$

Next, the value of the time constant τ at sample B is given as the ratio of the second and first derivatives, according to Equation 6:

$$\tau_B = \frac{(q_{V,C} - q_{V,A}) \cdot 2\Delta t}{q_{V,A} + q_{V,C} - q_{V,BLo} - q_{V,BHi}}. \tag{13}$$

Note that if τB cannot be calculated because the denominator is too close or equal to zero, then 2Δt can be increased by 64 seconds so that the measurement of τB can be attempted again at the next iteration with a larger time scale.

Another condition which typically requires increasing 2Δt occurs when τB can be measured, but the magnitude of the denominator of Equation 13 is less than a given threshold (for example, a threshold=32 seconds). In this case, the precision of τB is considered low; thus, the time interval 2Δt is increased for the next iteration.

The voltage-based state-of-charge measurements $q_V$ can be stored in a ring buffer with a maximum size of 128 elements indicating that the value of 2Δt is limited to a value of 8192 seconds. If the value of 2Δt is not increased for the next iteration (e.g., in the case of FIG. 5A), then during the next iteration, the samples that are used can be simply shifted by one value. However, if the value of 2Δt is increased for the next iteration (e.g., in the case of FIG. 5B), then sample C can be unchanged while sample B increases by one-half of an iteration.

When using the above-described technique to compute the first and second derivatives, the time scale increases as more precision is needed, and the sample at which the first and second derivatives are computed (e.g., sample point B) continuously moves forward with time.

In one embodiment, the relaxation-corrected state-of-charge $q_r$ is computed using Equation 7 at point A, using the time constant τB computed at point B:

$$q_r = q_{V,A} + \tau_B \cdot \frac{dq_V}{dt_A}. \tag{14}$$

In the above equation, the time derivative of the voltage-based state-of-charge at sample point A can be determined using the first and second derivatives at time B:

$$\frac{dq_V}{dt_A} = \frac{dq_V}{dt_B} + \frac{d^2 q_V}{dt_B^2} \cdot \Delta t. \tag{15}$$

As mentioned previously, to determine the moment of transition when Equation 7 becomes a valid SOC estimate, the time derivative of the relaxation-corrected $$\frac{dq_r}{dt}$$

state-of-charge can be computed. The derivative can be computed in the same manner as the derivative of $q_V$, but can have a unique time interval $\Delta t_{q_r}$ and a separate ring buffer. Because the second derivative is not needed, only two sample points (A and B) need to be tracked, for example:

$$\frac{dq_r}{dt} = \frac{q_{r,A} - q_{r,B}}{\Delta t_{q_r}}. \tag{16}$$

In one embodiment, the interval $\Delta t_{q_r}$ is increased by 64 seconds if the magnitude of the difference in the numerator of Equation 16 is less than a threshold (for example, a threshold=32 seconds). If the ring buffer for the $q_r$ values has a maximum size of 32 samples, then $\Delta t_{q_r}$ is limited to a value of 2048 seconds.

In one embodiment, the transition to using the relaxation-corrected state-of-charge $q_r$ for SOC estimates occurs when two consecutive values of the derivative of the relaxation-corrected state-of-charge $$\frac{dq_r}{dt}$$

estimate are less in magnitude $$\frac{dq_r}{dt}$$

than 0.4%/h r. This technique reduces the error caused by noise in the derivative. Once it is $$\frac{dq_r}{dt}.$$

determined that the transition has occurred, there is no longer a need to continue calculating Finally, a conservative estimate of the uncertainty in the relaxation-corrected state-of-charge σr can be computed as one-third of the magnitude of the correction based on two samples A and B:

$$\sigma_r = \frac{\tau_B}{3} \cdot \left|\frac{dq_V}{dt_A}\right|. \quad (17)$$

Note that while a specific implementation of the relaxation-corrected state-of-charge of Equation 7 was described in conjunction with FIGS. 4, 5A and 5B, the present invention is not limited to the specific implementation of Equation 7. In general, any implementation of Equation 7 which is capable of accurately determining (1) the first and second derivatives of $q_v$, (2) the moment when the transition occurs in the relaxation-corrected state-of-charge qr (or equivalently, the moment when $q_v$ becomes a single exponential), and (3) the uncertainty in the relaxation-corrected state-of-charge σr, can be used.

State-of-Charge Determination Process

Figure 6:
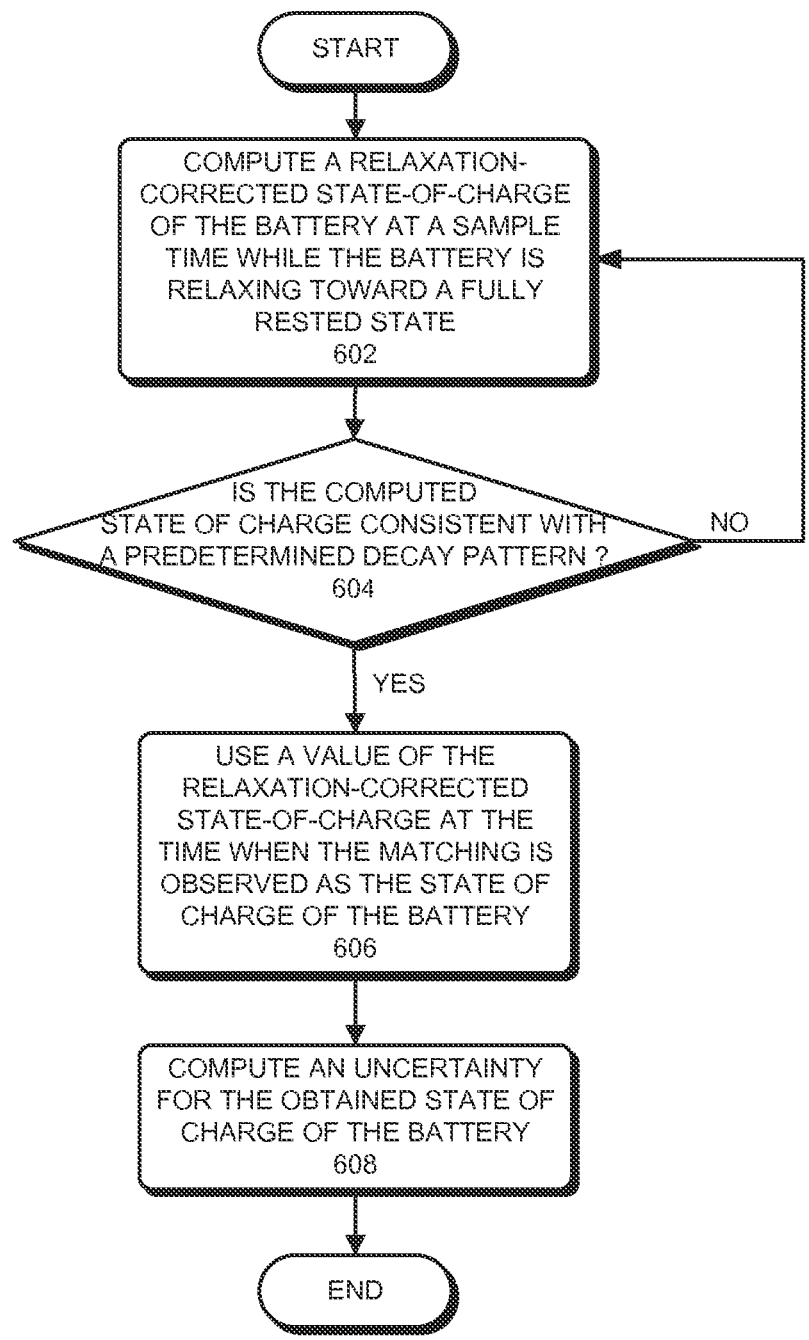
FIG. 6 presents a flowchart illustrating a process for determining a state of charge of a battery in accordance with some embodiments herein.

FIG. 6 presents a flowchart illustrating a process for determining a state of charge of a battery in accordance with some embodiments herein. At a high level, the process typically starts as the battery enters a relaxation stage, for example, when the charging has stopped. While the battery is relaxing toward a fully rested state, the system computes a relaxation-corrected state-of-charge of the battery at a sample time (step 602). A more detailed embodiment of step 602 is provided below in conjunction with FIG. 7. The system then determines if the relaxation-corrected state-of-charge at the sample time is substantially consistent with a predetermined decay pattern (step 604). In one embodiment, the predetermined decay pattern is a single exponential decay. In particular, the determination of step 604 is essentially equivalent to determining if the voltage-based state-of-charge substantially matches the predetermined decay pattern, e.g., a single exponential decay. In one embodiment, determining if the relaxation-corrected state-of-charge is substantially consistent with the predetermined decay pattern is based on whether the derivative of the relaxation-corrected state-of-charge is less than a predetermined threshold, for example, 0.4%/hr as mentioned above.

If the system determines that the relaxation-corrected state-of-charge is substantially consistent with the predetermined decay pattern, the system then uses a value of the relaxation-corrected state-of-charge at the time when the consistency is observed as the state of charge of the battery (step 606). Note that the determination of such consistency is essentially equivalent to a determination that the voltage-based state-of-charge substantially matches the predetermined decay pattern. The system additionally computes an uncertainty for the obtained state of charge of the battery (step 608). However, if the system determines that the relaxation-corrected state-of-charge is not substantially consistent with the predetermined decay pattern, the system returns to step 602 and continues monitoring the relaxation-corrected state-of-charge of the battery. Note that the determination of such inconsistency is essentially equivalent to a determination that the voltage-based state-of-charge does not substantially match the predetermined decay pattern.

Figure 7:
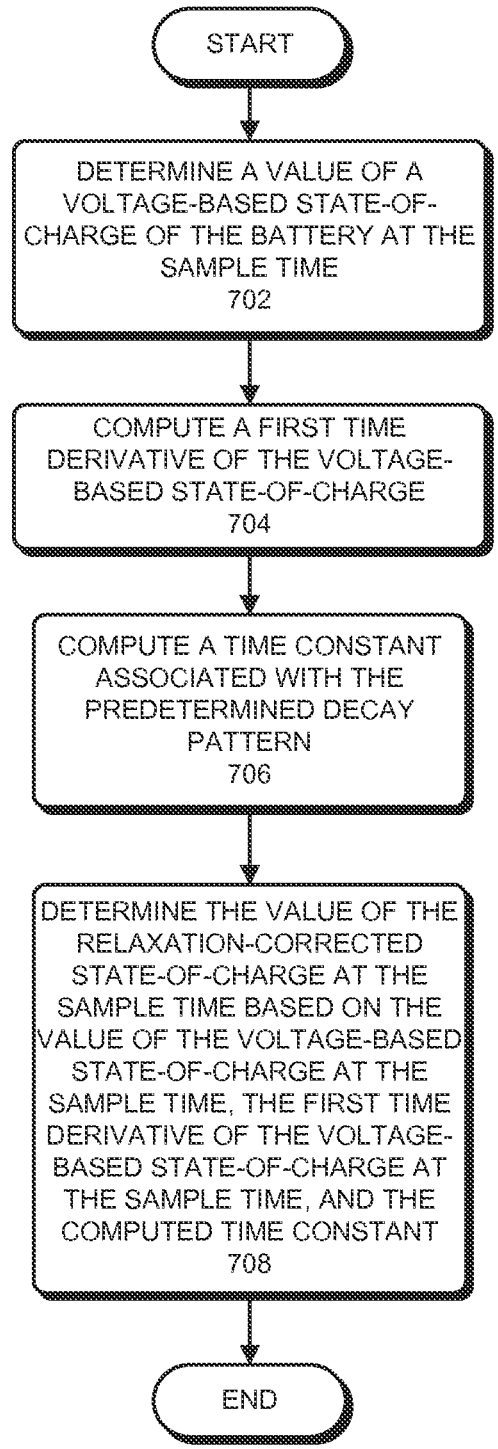
FIG. 7 presents a flowchart illustrating a process for determining a relaxation-corrected state-of-charge in accordance with some embodiments herein.

FIG. 7 presents a flowchart illustrating a process for determining a relaxation-corrected state-of-charge in step 602 of FIG. 6 in accordance with some embodiments herein. During operation, the system determines a value of a voltage-based state-of-charge of the battery at the sample time (step 702). In one embodiment, determining the value of the voltage-based state-of-charge involves first measuring an open circuit voltage of the battery at the sample time, and then determining the value of the voltage-based state-of-charge based on a predetermined voltage vs. SOC relationship which has been calibrated for the battery.

Next, the system computes a first time derivative of the voltage-based state-of-charge (step 704). The system additionally computes a time constant associated with the predetermined decay pattern (step 706). In one embodiment, to compute the time constant, the system further computes a second time derivative of the voltage-based state-of-charge. The system subsequently computes the time constant as the ratio of the first time derivative and the second time derivative of the voltage-based state-of-charge. Note that to compute the first and second time derivatives of the voltage-based state-of-charge, additional sample values of the voltage-based state-of-charge at earlier sample times are usually obtained.

Finally, the system determines the value of the relaxation-corrected state-of-charge at the sample time based on the value of the voltage-based state-of-charge at the sample time, the first time derivative of the voltage-based state-of-charge at the sample time, and the computed time constant (step 708). For example, step 708 can be implemented using Equation 14. In one embodiment, the system can also compute the uncertainty of the obtained state of charge described in step 608 using the first time derivative of the voltage-based state-of-charge at the sample time, and the computed time constant. More specifically, the uncertainty value can be obtained using Equation 17.

Battery Design

Figure 8:
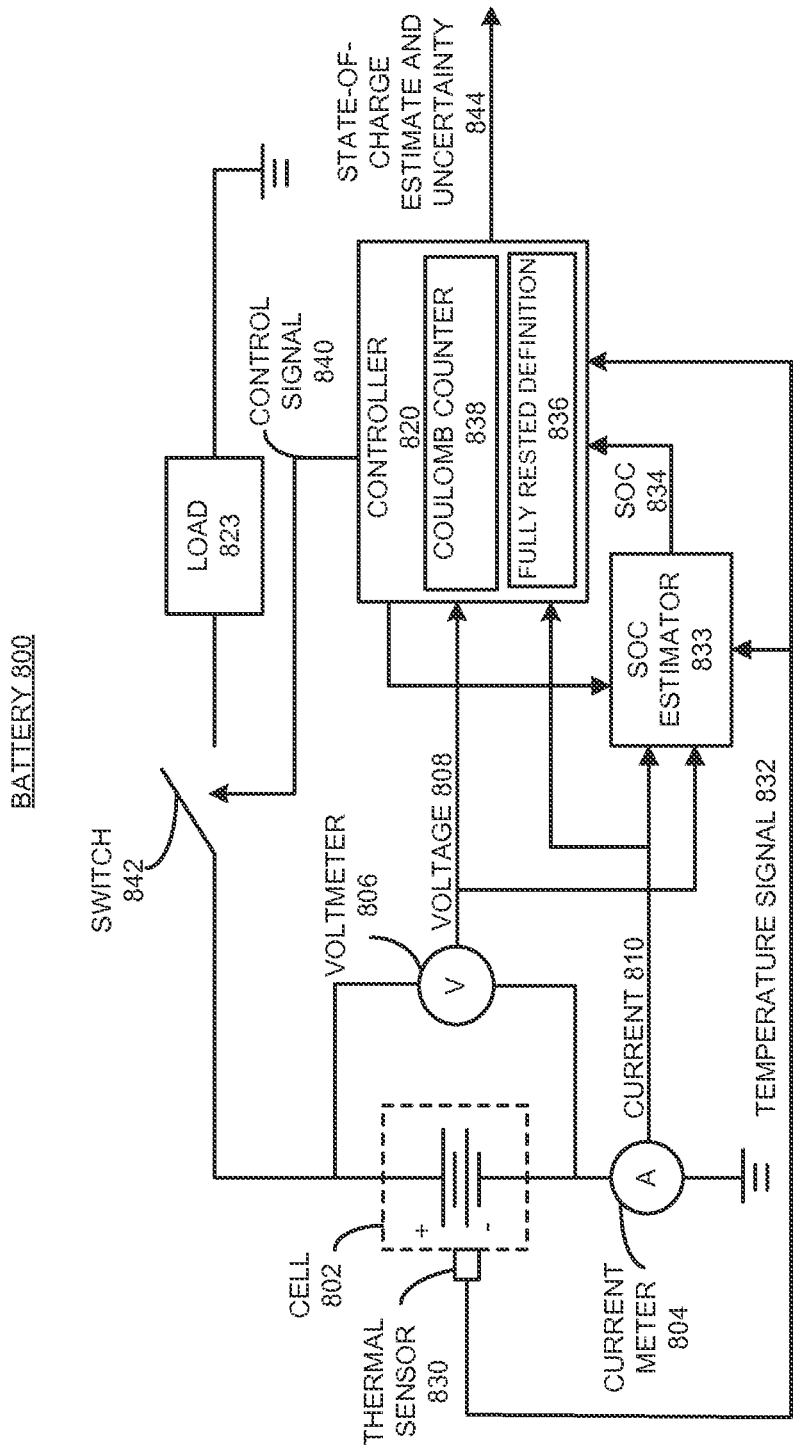
FIG. 8 illustrates a rechargeable battery that supports a state-of-charge estimate in accordance with some embodiments herein.

FIG. 8 illustrates a rechargeable battery 800 that supports a state-of-charge estimate in accordance with some embodiments herein. Battery 800 includes a battery cell 802. It also includes a current meter (current sensor) 804, which measures a current through cell 802, and a voltmeter (voltage sensor) 806, which measures a voltage across cell 802. Battery 800 also includes a thermal sensor 830, which measures the temperature of battery cell 802. (Note that numerous possible designs for current meters, voltmeters and thermal sensors are well-known in the art.)

Rechargeable battery 800 is coupled to a load 823 for a particular system. Note that, although load 823 is illustrated in FIG. 8, load 823 is not part of rechargeable battery 800. However, load 823 is associated with the discharging process, which draws power from cell 802 and subsequently causes cell 802 to discharge. Note that load 823 may change value over time during the discharging process, and a larger load 823 typically results in a larger discharging current.

The above-described state-of-charge estimation process is controlled by a controller 820, which receives: a voltage signal 808 from voltmeter 806, a current signal 810 from current meter 804, a temperature signal 832 from thermal sensor 830, and a state-of-charge value 834 from SOC estimator 833. Additionally, controller 820 stores at least one fully rested cell definition 836. This definition is used by controller 820 to determine when the relaxation-corrected state-of-charge estimate can be used as the state-of-charge estimate of cell 802. Controller 820 can include a coulomb counter 838 for estimating the amount of charge flow ΔQ based on current 810 during a charging/discharging process. Controller 820 can also generate a control signal 840 for controlling a switch 842. In some embodiments, control signal 840 can be used to turn off switch 842 to decouple load 823.

SOC estimator 833 receives a voltage 808 from voltmeter 806, a current 810 from current meter 804 and a temperature 832 from thermal sensor 830, and outputs a voltage-based state-of-charge value 834. During a relaxation period of cell 802, controller 820 controls SOC estimator 833 to generate a set of voltage-based state-of-charge values corresponding to a set of sample points. Controller 820 computes a relaxation-corrected state-of-charge estimate based on the set of voltage-based state-of-charge values and outputs a state-of-charge estimate 844 of cell 802 and an associated uncertainty when the relaxation-corrected state-of-charge matches the fully rested definition 836.

Note that controller 820 can be implemented using either a combination of hardware and software or purely hardware. In one embodiment, controller 820 is implemented using a microcontroller, which includes a microprocessor that executes instructions which control the full charge capacity update process.

CONCLUSION

By assuming that all of the higher order exponentials go to zero, the proposed technique can systematically underestimate the correction. Consequently, when these higher order exponentials are not negligible, both the relaxation-corrected state-of-charge $q_r$, and the associated uncertainty can be significantly underestimated. In some embodiments, corrections can be made to compensate for the higher order exponentials, for example, by taking the k=2 terms into account for estimating the uncertainty. After this correction is included in $q_r$, the uncertainty can be reduced because it was previously comprised of this correction and the noise in the calculations of the first and second derivatives.

The noise in the derivative of the relaxation-corrected state-of-charge $q_r$, can cause the system to prematurely determine that the corrected estimate is valid. To account for this noise problem, some embodiments also include the requirement that two consecutive derivative estimates be below a threshold. Another approach would be to filter the derivative results to reduce the chance of random fluctuations causing problems.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

The invention claimed is:

1. A method for estimating a state of charge for a battery, comprising:
  while the battery is relaxing toward a fully rested state, determining if a modified state of charge of the battery is substantially consistent with a predetermined decay pattern; and
  if so, estimating the state of charge of the battery as a value of the modified state of charge determined at the time when the consistency is observed;
  otherwise, continuing monitoring the modified state of charge of the battery.

2. The method of claim 1, wherein the predetermined decay pattern is a single exponential decay.

3. The method of claim 1, wherein determining if the modified state of charge of the battery is substantially consistent with the predetermined decay pattern involves:
  computing a rate of change of the modified state of charge; and
  determining whether the rate of change of the modified state of charge has become less than a threshold rate of change.

4. The method of claim 3, wherein computing the rate of change of the modified state of charge involves computing both a first value of the modified state of charge at a first time and a second value of the modified state of charge at a second time, wherein the first time and the second time are associated with a predetermined time interval.

5. The method of claim 1, wherein the method further comprises deriving the modified state of charge from a voltage-based state of charge of the battery, and wherein determining if the modified state of charge of the battery is substantially consistent with the predetermined decay pattern is equivalent to determining if the voltage-based state of charge substantially matches the predetermined decay pattern.

6. The method of claim 5, wherein deriving the modified state of charge from a voltage-based state of charge of the battery involves:
  determining one or more sample values of the voltage-based state of charge of the battery;
  computing a first time derivative of the voltage-based state of charge;
  computing a time constant associated with the predetermined decay pattern; and
  determining the value of the modified state of charge based on the one or more sample values of the voltage-based state of charge, the first time derivative of the voltage-based state of charge, and the time constant.

7. The method of claim 6, wherein computing the time constant associated with the predetermined decay pattern further involves:
  computing a second time derivative of the voltage-based state of charge; and
  computing the time constant as the ratio of the first time derivative and the second time derivative of the voltage-based state of charge.

8. The method of claim 6, wherein determining the value of the voltage-based state of charge involves:
  measuring an open circuit voltage of the battery; and
  determining the value of the voltage-based state of charge based at least on the open circuit voltage.

9. The method of claim 6, wherein after estimating the state of charge of the battery, the method further comprises determining an uncertainty of the estimated state of charge.

10. The method of claim 9, wherein the uncertainty of the estimated state of charge is substantially equal to a fraction of the difference between the value of the modified state of charge and the value of the voltage-based state of charge at the time when the consistency is observed.

11. The method of claim 10, wherein the fraction is ⅓.

12. The method of claim 3, wherein the threshold rate of change is about 0.4%/hour.

13. The method of claim 1, wherein the method further comprises:
  determining a coulomb-counting-based state of charge of the battery; and
  computing an updated state of charge of the battery based on both the modified state of charge and the coulomb-counting-based state of charge at the time when the consistency is observed.

14. The method of claim 1, wherein after determining that the modified state of charge of the battery is not consistent with the predetermined decay pattern, the method further comprises estimating the state of charge of the battery using the coulomb-counting-based state of charge.

15. A non-transitory computer-readable storage medium storing instructions that when executed by a controller for a battery cause the controller to perform a method for estimating a state of charge of the battery, the method comprising:

while the battery is relaxing toward a fully rested state, determining if a modified state of charge of the battery is substantially consistent with a predetermined decay pattern; and if so, estimating the state of charge of the battery as a value of the modified state of charge determined at the time when the consistency is observed;

otherwise, continuing monitoring the modified state of charge of the battery.

16. The non-transitory computer-readable storage medium of claim 15, wherein the predetermined decay pattern is a single exponential decay.

17. The non-transitory computer-readable storage medium of claim 15, wherein determining if the modified state of charge of the battery is substantially consistent with the predetermined decay pattern involves:

computing a rate of change of the modified state of charge; and determining whether the rate of change of the modified state of charge has become less than a threshold rate of change.

18. The non-transitory computer-readable storage medium of claim 17, wherein computing the rate of change of the modified state of charge involves computing both a first value of the modified state of charge at a first time and a second value of the modified state of charge at a second time, wherein the first time and the second time are associated with a predetermined time interval.

19. The non-transitory computer-readable storage medium of claim 15, wherein the method further comprises deriving the modified state of charge from a voltage-based state of charge of the battery, and wherein determining if the modified state of charge of the battery is substantially consistent with the predetermined decay pattern is equivalent to determining if the voltage-based state of charge substantially matches the predetermined decay pattern.

20. The non-transitory computer-readable storage medium of claim 19, wherein deriving the modified state of charge from a voltage-based state of charge of the battery involves:

determining one or more sample values of the voltage-based state of charge of the battery;

computing a first time derivative of the voltage-based state of charge;

computing a time constant associated with the predetermined decay pattern; and determining the value of the modified state of charge based on the one or more sample values of the voltage-based state of charge, the first time derivative of the voltage-based state of charge, and the time constant.

21. The non-transitory computer-readable storage medium of claim 20, wherein computing the time constant associated with the predetermined decay pattern further involves:

computing a second time derivative of the voltage-based state of charge; and computing the time constant as the ratio of the first time derivative and the second time derivative of the voltage-based state of charge.

22. The non-transitory computer-readable storage medium of claim 20, wherein determining the value of the voltage-based state of charge involves:

measuring an open circuit voltage of the battery; and determining the value of the voltage-based state of charge based at least on the open circuit voltage.

23. The non-transitory computer-readable storage medium of claim 20, wherein after estimating the state of charge of the battery, the method further comprises determining an uncertainty of the estimated state of charge.

24. The non-transitory computer-readable storage medium of claim 23, wherein the uncertainty of the estimated state of charge is substantially equal to a fraction of the difference between the value of the modified state of charge and the value of the voltage-based state of charge at the time when the consistency is observed.

* * * * *